United States Patent [19]
Mester

[11] Patent Number: 5,490,154
[45] Date of Patent: Feb. 6, 1996

[54] METHOD OF AND CIRCUIT ARRANGEMENT FOR DECODING RS-CODED DATA SIGNALS

[75] Inventor: Roland Mester, Darmstadt, Germany

[73] Assignee: U.S. Philips Corporation, New York, N.Y.

[21] Appl. No.: 379,109

[22] Filed: Jan. 27, 1995

Related U.S. Application Data

[63] Continuation of Ser. No. 984,759, Dec. 3, 1992, abandoned.

[30] Foreign Application Priority Data

Dec. 4, 1991 [DE] Germany ............................ 41 40 018.6

[51] Int. Cl.[6] .................................................. G06F 11/00
[52] U.S. Cl. ......................................... 371/37.1; 371/38.1
[58] Field of Search .................................. 371/37.1–37.4, 371/37.7, 38.1, 39.1

[56] References Cited

U.S. PATENT DOCUMENTS

| | | | |
|---|---|---|---|
| 4,873,688 | 10/1989 | Maki et al. ............................ | 371/37.1 |
| 5,038,350 | 8/1991 | Mester ................................... | 371/37.4 |
| 5,099,482 | 3/1992 | Cameron et al. ..................... | 371/37.1 |
| 5,107,503 | 4/1992 | Riggle et al. . | |
| 5,170,399 | 12/1992 | Cameron et al. ..................... | 371/37.1 |
| 5,197,669 | 10/1992 | Yu et al. ............................... | 371/37.7 |
| 5,241,546 | 8/1993 | Peterson et al. ...................... | 371/371.1 |
| 5,297,153 | 3/1994 | Baggen et al. ........................ | 371/37.1 |

OTHER PUBLICATIONS

"On–The–Fly Decoder For Multiple Byte Errors", by A. M. Patel, IBM J. Res. Develop. vol. 30, No. 3, May 1986, pp. 259–269.

"A 40–MHZ Encoder–Decoder Chip Generated By A Reed–Solomon Code Compiler", by P. Tong, Proceedings of the IEEE 1990 Custom Integrated Circuits Conference, May 13–16, 1990, pp. 13.5.1–13.5.4.

*Primary Examiner*—Roy N. Envall, Jr.
*Assistant Examiner*—Brian C. Oakes
*Attorney, Agent, or Firm*—David R. Treacy

[57] ABSTRACT

A method of and a circuit arrangement for decoding RS-coded data signals is which data signals may be coded both in accordance with a code generator polynomial $G(x)=(x+\alpha^0)(x+\alpha^1)\ldots(x+\alpha^{15})$ and in accordance with a code generator polynomial $G(x)=(x+\alpha^{120})(x+\alpha^{121})\ldots(x+\alpha^{135})$.

Dependent on the relevant code generator polynomial, switching takes place between two different constant multipliers in syndrome generators, and syndromes and erasure locations which have been determined are subjected to a Euclid's algorithm for deriving error location polynomials and error value polynomials. Error locations and error values for a code generator polynomial starting with $\alpha^0$ are computed by means of a Chien zero search. Parallel thereto, a correction factor for a code generator polynomial starting with $\alpha^{120}$ is determined. The computed error values of the code generator polynomial starting with $\alpha^0$ are multiplied by this correction factor when data signals of the code generator polynomial starting with $\alpha^{120}$ are decoded.

10 Claims, 12 Drawing Sheets

Terms for factor : $a^0$
0 = 0
1 = 1
2 = 2
3 = 3
4 = 4
5 = 5
6 = 6
7 = 7

Terms for factor : $a^1$
0 = 7
1 = 0
2 = 7 + 1
3 = 7 + 2
4 = 7 + 3
5 = 4
6 = 5
7 = 6

Terms for factor : $a^2$
0 = 6
1 = 7
2 = 6 + 0
3 = 7 + 6 + 1
4 = 7 + 6 + 2
5 = 7 + 3
6 = 4
7 = 5

Terms for factor : $a^3$
0 = 5
1 = 6
2 = 7 + 5
3 = 6 + 5 + 0
4 = 7 + 6 + 5 + 1
5 = 7 + 6 + 2
6 = 7 + 3
7 = 4

FIG. 6a

Terms for factor : $a^4$
```
0 =   4
1 =   5
2 =   6 +   4
3 =   7 +   5 +   4
4 =   6 +   5 +   4 +   0
5 =   7 +   6 +   5 +   1
6 =   7 +   6 +   2
7 =   7 +   3
```

Terms for factor : $a^5$
```
0 =   7 +   3
1 =   4
2 =   7 +   5 +   3
3 =   7 +   6 +   4 +   3
4 =   5 +   4 +   3
5 =   6 +   5 +   4 +   0
6 =   7 +   6 +   5 +   1
7 =   7 +   6 +   2
```

Terms for factor : $a^6$
```
0 =   7 +   6 +   2
1 =   7 +   3
2 =   7 +   6 +   4 +   2
3 =   6 +   5 +   3 +   2
4 =   4 +   3 +   2
5 =   5 +   4 +   3
6 =   6 +   5 +   4 +   0
7 =   7 +   6 +   5 +   1
```

Terms for factor : $a^7$
```
0 =   7 +   6 +   5 +   1
1 =   7 +   6 +   2
2 =   6 +   5 +   3 +   1
3 =   5 +   4 +   2 +   1
4 =   7 +   3 +   2 +   1
5 =   4 +   3 +   2
6 =   5 +   4 +   3
7 =   6 +   5 +   4 +   0
```

FIG. 6b

Terms for factor : $a^8$

0 = 6 + 5 + 4 + 0
1 = 7 + 6 + 5 + 1
2 = 7 + 5 + 4 + 2 + 0
3 = 4 + 3 + 1 + 0
4 = 6 + 2 + 1 + 0
5 = 7 + 3 + 2 + 1
6 = 4 + 3 + 2
7 = 5 + 4 + 3

Terms for factor : $a^9$

0 = 5 + 4 + 3
1 = 6 + 5 + 4 + 0
2 = 7 + 6 + 4 + 3 + 1
3 = 7 + 3 + 2 + 0
4 = 5 + 1 + 0
5 = 6 + 2 + 1 + 0
6 = 7 + 3 + 2 + 1
7 = 4 + 3 + 2

Terms for factor : $a^{10}$

0 = 4 + 3 + 2
1 = 5 + 4 + 3
2 = 6 + 5 + 3 + 2 + 0
3 = 7 + 6 + 2 + 1
4 = 7 + 4 + 0
5 = 5 + 1 + 0
6 = 6 + 2 + 1 + 0
7 = 7 + 3 + 2 + 1

Terms for factor : $a^{11}$

Terms for factor : $\alpha^{12}$
```
0 =   6 +   2 +   1 +   0
1 =   7 +   3 +   2 +   1
2 =   6 +   4 +   3 +   1 +   0
3 =   7 +   6 +   5 +   4 +   0
4 =   7 +   5 +   2
5 =   6 +   3
6 =   7 +   4 +   0
7 =   5 +   1 +   0
```

Terms for factor : $\alpha^{13}$
```
0 =   5 +   1 +   0
1 =   6 +   2 +   1 +   0
2 =   7 +   5 +   3 +   2 +   0
3 =   6 +   5 +   4 +   3
4 =   7 +   6 +   4 +   1
5 =   7 +   5 +   2
6 =   6 +   3
7 =   7 +   4 +   0
```

Terms for factor : $\alpha^{14}$
```
0 =   7 +   4 +   0
1 =   5 +   1 +   0
2 =   7 +   6 +   4 +   2 +   1
3 =   5 +   4 +   3 +   2
4 =   7 +   6 +   5 +   3 +   0
5 =   7 +   6 +   4 +   1
6 =   7 +   5 +   2
7 =   6 +   3
```

Terms for factor : $\alpha^{15}$
```
0 =   6 +   3
1 =   7 +   4 +   0
2 =   6 +   5 +   3 +   1 +   0
3 =   7 +   4 +   3 +   2 +   1
4 =   6 +   5 +   4 +   2
5 =   7 +   6 +   5 +   3 +   0
6 =   7 +   6 +   4 +   1
7 =   7 +   5 +   2
```

FIG. 6d

Terms for factor : $a^{120}$

| | | | | | | |
|---|---|---|---|---|---|---|
| 0 = | 5 + | 4 + | 3 + | 0 | | |
| 1 = | 6 + | 5 + | 4 + | 1 + | 0 | |
| 2 = | 7 + | 6 + | 4 + | 3 + | 2 + | 1 |
| 3 = | 7 + | 2 + | 0 | | | |
| 4 = | 5 + | 4 + | 1 + | 0 | | |
| 5 = | 6 + | 5 + | 2 + | 1 + | 0 | |
| 6 = | 7 + | 6 + | 3 + | 2 + | 1 | |
| 7 = | 7 + | 4 + | 3 + | 2 | | |

Terms for factor : $a^{121}$

| | | | | | | |
|---|---|---|---|---|---|---|
| 0 = | 7 + | 4 + | 3 + | 2 | | |
| 1 = | 5 + | 4 + | 3 + | 0 | | |
| 2 = | 7 + | 6 + | 5 + | 3 + | 2 + | 1 + | 0 |
| 3 = | 6 + | 1 | | | | |
| 4 = | 4 + | 3 + | 0 | | | |
| 5 = | 5 + | 4 + | 1 + | 0 | | |
| 6 = | 6 + | 5 + | 2 + | 1 + | 0 | |
| 7 = | 7 + | 6 + | 3 + | 2 + | 1 | |

Terms for factor : $a^{122}$

| | | | | | | |
|---|---|---|---|---|---|---|
| 0 = | 7 + | 6 + | 3 + | 2 + | 1 | |
| 1 = | 7 + | 4 + | 3 + | 2 | | |
| 2 = | 7 + | 6 + | 5 + | 4 + | 2 + | 1 + | 0 |
| 3 = | 5 + | 0 + | | | | |
| 4 = | 7 + | 3 + | 2 | | | |
| 5 = | 4 + | 3 + | 0 | | | |
| 6 = | 5 + | 4 + | 1 + | 0 | | |
| 7 = | 6 + | 5 + | 2 + | 1 + | 0 | |

Terms for factor : $a^{123}$

| | | | | | | |
|---|---|---|---|---|---|---|
| 0 = | 6 + | 5 + | 2 + | 1 + | 0 | |
| 1 = | 7 + | 6 + | 3 + | 2 + | 1 | |
| 2 = | 7 + | 6 + | 5 + | 4 + | 3 + | 1 + | 0 |
| 3 = | 7 + | 4 | | | | |
| 4 = | 6 + | 2 + | 1 | | | |
| 5 = | 7 + | 3 + | 2 | | | |
| 6 = | 4 + | 3 + | 0 | | | |
| 7 = | 5 + | 4 + | 1 + | 0 | | |

FIG. 7a

Terms for factor : $a^{124}$

```
0 =  5 +  4 +  1 +  0
1 =  6 +  5 +  2 +  1 +  0
2 =  7 +  6 +  5 +  4 +  3 +  2 +  0
3 =  7 +  6 +  3
4 =  7 +  5 +  1 +  0
5 =  6 +  2 +  1
6 =  7 +  3 +  2
7 =  4 +  3 +  0
```

Terms for factor : $a^{125}$

```
0 =  4 +  3 +  0
1 =  5 +  4 +  1 +  0
2 =  6 +  5 +  4 +  3 +  2 +  1
3 =  7 +  6 +  5 +  2
4 =  7 +  6 +  4 +  0
5 =  7 +  5 +  1 +  0
6 =  6 +  2 +  1
7 =  7 +  3 +  2
```

Terms for factor : $a^{126}$

```
0 =  7 +  3 +  2
1 =  4 +  3 +  0
2 =  7 +  5 +  4 +  3 +  2 +  1 +  0
3 =  7 +  6 +  5 +  4 +  1
4 =  6 +  5 +  3
5 =  7 +  6 +  4 +  0
6 =  7 +  5 +  1 +  0
7 =  6 +  2 +  1
```

Terms for factor : $a^{127}$

Terms for factor : $a^{128}$

```
0 =   7 +   5 +   1 +   0
1 =   6 +   2 +   1
2 =   5 +   3 +   2 +   1 +   0
3 =   7 +   6 +   5 +   4 +   3 +   2
4 =   6 +   4 +   3 +   1
5 =   7 +   5 +   4 +   2
6 =   6 +   5 +   3
7 =   7 +   6 +   4 +   0
```

Terms for factor : $a^{129}$

```
0 =   7 +   6 +   4 +   0
1 =   7 +   5 +   1 +   0
2 =   7 +   4 +   2 +   1 +   0
3 =   7 +   6 +   5 +   4 +   3 +   2 +   1
4 =   5 +   3 +   2 +   0
5 =   6 +   4 +   3 +   1
6 =   7 +   5 +   4 +   2
7 =   6 +   5 +   3
```

Terms for factor : $a^{130}$

```
0 =   6 +   5 +   3
1 =   7 +   6 +   4 +   0
2 =   7 +   6 +   3 +   1 +   0
3 =   7 +   6 +   5 +   4 +   3 +   2 +   1 +   0
4 =   7 +   4 +   2 +   1
5 =   5 +   3 +   2 +   0
6 =   6 +   4 +   3 +   1
7 =   7 +   5 +   4 +   2
```

Terms for factor : $a^{131}$

TERMS FOR FACTOR: $\alpha^{132}$

```
0 =   6 +   4 +   3 +   1
1 =   7 +   5 +   4 +   2
2 =   5 +   4 +   1
3 =   5 +   4 +   3 +   2 +   1 +   0
4 =   5 +   2 +   0
5 =   6 +   3 +   1 +   0
6 =   7 +   4 +   2 +   1
7 =   5 +   3 +   2 +   0
```

TERMS FOR FACTOR: $\alpha^{133}$

```
0 =   5 +   3 +   2 +   0
1 =   6 +   4 +   3 +   1
2 =   7 +   4 +   3 +   0
3 =   4 +   3 +   2 +   1 +   0
4 =   4 +   1
5 =   5 +   2 +   0
6 =   6 +   3 +   1 +   0
7 =   7 +   4 +   2 +   1
```

TERMS FOR FACTOR: $\alpha^{134}$

```
0 =   7 +   4 +   2 +   1
1 =   5 +   3 +   2 +   0
2 =   7 +   6 +   3 +   2
3 =   3 +   2 +   1 +   0
4 =   7 +   3 +   0
5 =   4 +   1
6 =   5 +   2 +   0
7 =   6 +   3 +   1 +   0
```

TERMS FOR FACTOR: $\alpha^{135}$

METHOD OF AND CIRCUIT ARRANGEMENT FOR DECODING RS-CODED DATA SIGNALS

This is a continuation of pending prior application Ser. No. 07/984,759, filed on Dec. 3, 1992, abandoned.

BACKGROUND OF THE INVENTION

The invention relates to a method of decoding Reed-Solomon (RS)-coded data signals as described in the introductory part of claim 1.

An RS code is a systematic block code of the length n, in which k information symbols are added to (n−k)=p check words. Information symbols are not changed by the coding process. The RS code has a minimum Hamming distance of d=p+1 which can be optionally used in a decoding operation for error recognition or error correction.

In a decoding operation there is no distinction between data words and check words. An RS code block comprises n symbols, a symbol having a width of $\geq 1$ bits. A symbol width of 8 bits is generally used. For each symbol error t, 2t check words are required for a correction in order to compute an error location $X_i$ and an error value $Y_i$. If the erroneous symbol is marked as an erasure, the error location $X_i$ is known. In this case only a single check word is required for computing the error value $Y_i$. For RS codes the relation 2t+e$\leq$p=n−k=d−1 applies, in which e indicates the number of erasures. In connection with recording and reproducing data signals on/from magnetic tapes, the term erasures is understood to include drop-out disturbances in the reproduced data signal or drop-out of a data transmission channel and an associated data signal drop-out. Further details on RS codes can be found in the magazine "IBM Journal RES Develop": "On-the-fly decoder for multiple byte errors", vol. 30, no. 3, May 1986, pp. 259 to 269.

Principally, an RS code of the distance d is defined via the code generator polynomial $$G(x) = \prod_{i=b}^{b+(d-2)} (x + \alpha^i)$$

It is essential that G(x) has p consecutive zeros.

In many RS codes b is set 0, but b may alternatively be an arbitrary constant which is smaller than $2^m$. For example, in the D1 standard (Standard for Recording Digital Television Signals on Magnetic Tape in Cassettes; European Broadcast Union; Tech 3252-E) a code generator polynomial starting with b=0 is fixed in conformity with $G(x)=(x+\alpha^0)(x+\alpha^1) \ldots (x+\alpha^{15})$ and in an ISO standard a code generator polynomial starting with b=120 is fixed in conformity with $G(x)=(x+\alpha^{120}) \ldots (x+\alpha^{135})$. Both code generator polynomials are only distinguished by a constant offset in exponents of $\alpha$.

A circuit arrangement for decoding RS-coded data is known from the conference publication "IEEE 1990 Custom Integrated Circuits Conference": "A 40 MHz Encoder/Decoder Chip generated by a Reed-Solomon Code Compiler" pp. 13.5.1 to 13.5.4, CH 2860-5/90/0000-0065. In this arrangement syndromes of the received data words of a transmission channel are computed in a first stage. In a subsequent, second stage error location and error value polynomials of these syndromes are computed in accordance with a Euclid's algorithm, which polynomials are subsequently subjected to a Chien zero search in a third stage. With the aid of the error locations and error values thus determined, the actual correction of the data present is performed by means of an exclusive-OR gate in a fourth stage. This known circuit arrangement can only decode a data signal generated in accordance with the code generator polynomial $G(x)=(x+\alpha^0)(x+\alpha^1) \ldots (x+\alpha^{15})$.

SUMMARY OF THE INVENTION

It is an object of the present invention to provide a method and a circuit arrangement of the type described in the opening paragraph with which data signals present at a higher data rate (>100 Mbit/s), which may be coded in accordance with the code generator polynomial $G(x)=(x+\alpha^0)(x+\alpha^1) \ldots (x+\alpha^{15})$ or $G(x)=(x+\alpha^{120})(x+\alpha^{121}) \ldots (x+\alpha^{135})$ can be decoded in real time.

This object is solved by the features described in the characterizing parts of claims 1 and 2.

A circuit arrangement implemented in accordance with the method according to the invention has the advantage that in a single arrangement RS-coded data signals which may be coded in accordance with two distinctive code generator polynomials, are optionally decoded, while the number of additional components will remain limited.

Advantageous further embodiments and improvements of the circuit arrangement described in claim 1 are possible by taking the measures described in the sub-claims.

BRIEF DESCRIPTION OF THE DRAWINGS

These and other aspects of the invention will be apparent from and elucidated with reference to the embodiments described hereinafter. In the drawings:

FIGS. 6a, 6b, 6c and 6d show Tables for constant multiplication by $\alpha^0$ to $\alpha^{15}$ and FIGS. 7a, 7b, 7c and 7d show Tables for constant multiplication by $\alpha^{120}$ to $\alpha^{135}$.

DESCRIPTION OF THE PREFERRED EMBODIMENTS

Figure 1:
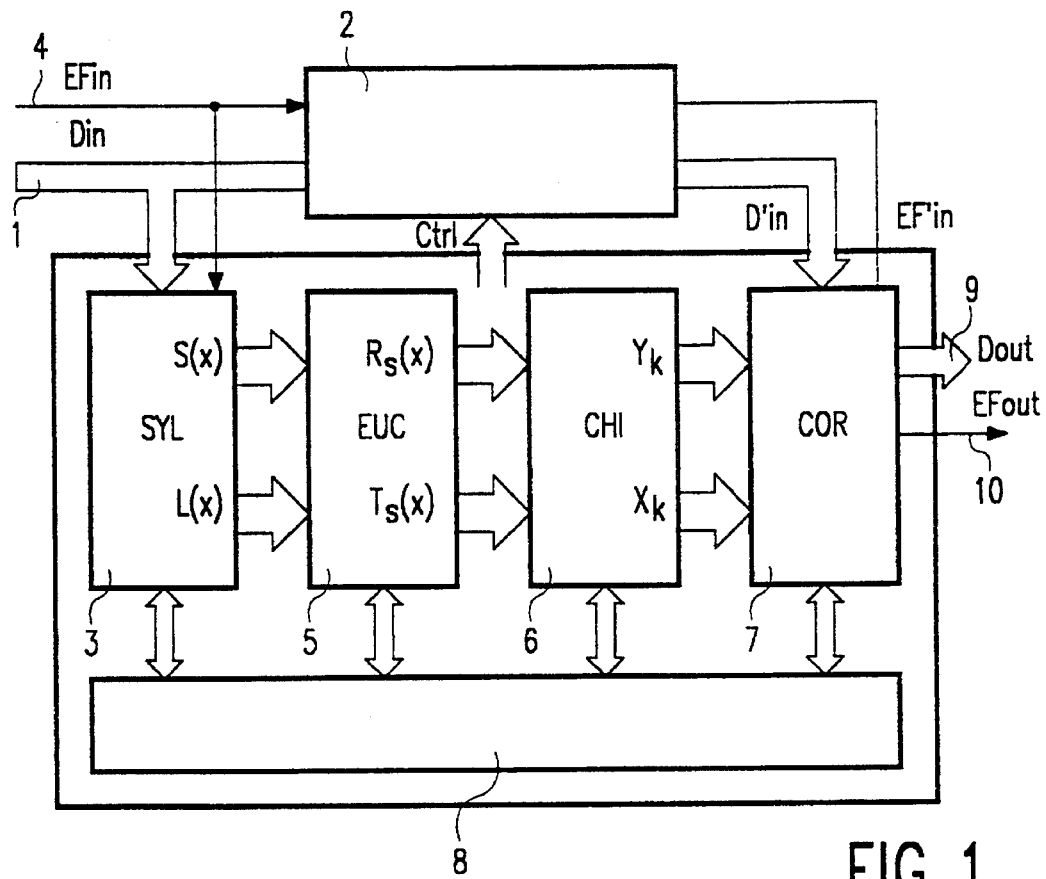
FIG. 1 is a block diagram of an RS decoder.

In accordance with the definition, each symbol with m bits is the element of a Galois field $GF(2^m)$ in RS codes. The sequence of $2^m$ symbols as a basis for the finite field arithmetics is defined by the field generator polynomial p(x). The symbol width limits the maximum block length of an RS code of $2^{m-1}$ because the elements of the field are required as an unambiguous position number in the block. A zero is a neutral element with regard to the addition and an expression $\alpha^0=1$ is a neutral element of a multiplication. A field is thus defined via an irreducible field generator polynomial. If a primitive element $\alpha$ of the number m is defined, all subsequent elements can be expressed as powers of $\alpha$. Since $\alpha$ is a root of p(x), and since further only m roots unequal to zero exist, it holds that p(x)=0 for all further elements. The Galois field can thus be defined as a finite sequence of $2^{m-1}$ elements. The binary component representation provides the possibility of a simple addition via a bit-wise exclusive-OR gate and an exponent representation provides the possibility of a simple multiplication via addition of the exponents modulo-$q=2^{m-1}$. In a circuit transformation this corresponds to a binary adder whose carry output is connected to a carry input.

As already stated in the opening paragraph, an RS code is generally defined via the code generator polynomial $$G(x) = \prod_{i=b}^{b+(d-2)} (x + \alpha^i)$$

A legal code vector c(x) is produced by dividing, by G(x), an information vector $i(x)*x^p$ shifted over p positions and by attaching the resultant parity vector p(x) in the cleared positions of the information vector i(x). The resultant code vector c(x) is divisible by all roots of G(x) without any remainder. The single polynomials and vectors can be represented as follows:

$i(x) = i_{k-1}x^{k-1} + i_{k-2}x^{k-2} + \ldots + i_1x^1 + i_0$  information polynomial
$p(x) = (i(x)*x^p) \bmod G(x)$  parity polynomial
$c(x) = (i(x)*x^p) + p(x)$  code polynomial
$c_i = (i_{k-1}, i_{k-2}, \ldots, i_1, i_0, p_{p-1}, p_{p-2}, \ldots, p_1, p_0)$  code vector =
$\quad = (c_{n-1}, c_{n-2}, \ldots, c_1, c_0)$  transmitted vector
$e_i = (e_{n-1}, e_{n-2}, \ldots, e_1, e_0)$  error vector
$u_i = (u_{n-1}, u_{n-2}, \ldots, u_1, u_0)$  erasure vector
$r_l = c_i + e_i + u_i$  received vector The error vector $e_i$ is unequal to zero at a maximum of t positions, otherwise it is equal to zero. This also holds for the erasure vector $u_i$ which is unequal to zero at a maximum of e positions. When $e_i$ and $u_i$ intersect at equal positions, errors become erasures.

A transmitted RS-coded code block c(x) comprises k information positions, followed by p check words. This code construction guarantees that c(x) is divisible by all roots by G(x) without a remainder as long as no error e(x) or erasures u(x) occur. The development of a received vector r(x) at the roots of the code generator polynomial G(x) generates values which are dependent on received errors but which are not dependent on the transmitted information i(x). These values are denoted as syndromes. The m syndromes $S_j$ (j=0 ... d-2) are computed in accordance with the equation $$S_{b+j} = \sum_{i=0}^{n-1} r_i(\alpha^{i*(b+j)}) = \sum_{k=o}^{e+t-1} Y_k(X_k)^{(b+j)}$$

The received vector (x) can be described as follows in a polynomial representation:

$r(x)=r_{n-1}+x^{n-1}x^{n-2}++r_1x^1+r_0$.

In this relation x indicates a position in the polynomial for each received symbol $r_i$. The first received (data) symbol is $r_{n-1}$, the last is the (parity) symbol $r_0$. For storing the polynomial, only the coefficients $r_i$ must be filed.

Since the development of a received vector r(x) without errors at a zero of the code generator polynomial yields the value of zero, the values of the syndromes can be considered as sums of the position-weighted errors $Y_k$ at the positions $X_k$. The syndromes represent remainders of a division of the data stream r(x) by all factors $(x+\alpha^i)$ of the code generator polynomial, in which $$S_j = \sum_{k=0}^{e+t-1} Y_k(X_k)^j \text{ (for all syndromes } S_0 \ldots S_{d-2} \text{ if } b = 0)$$

If the position of an occurrence $X_k$ is retained at an erasure, $X_k$ can be computed to e=p erasures, while using p syndromes and p error locations and as long as 2t+e≤p, in which t is the number of non-marked errors.

In accordance with the equation stated hereinbefore, the syndromes constitute a record of p non-linear equations so that p solutions can be found. The solutions of the equation system are coefficients of an error location polynomial which has the value of zero at the error locations.

Decoding of RS-coded data blocks in accordance with said Euclid's algorithm is described in the journal "IEEE Proceedings: "Simplified procedure for correcting both errors and erasures of RS code using Euclid's algorithm, vol. 135, Pt. E, no. 6, November 1988 by Truong Eastman Reed HSU. The Euclid's algorithm can be subdivided into the following steps.

1. Computation of the syndromes $S_j$ and the polynomial of erasure locations L(x) and setting of e=deg{L(x)}.
2. Computation of a Forney syndrome
   $\tau(x)=S(x)L(X)$ rood $x^{d-1}$
3. For e=d−1=p, T(x) is set L(x) and R(x) is set τ(x). Otherwise, T(x) and R(x) are determined by using a Euclid's algorithm. The Euclid's algorithm comprises the following recursive formulas:
   $T_s(x)=(Q_{s-1}(x)T_{s-1}(x)+T_{s-2}(x)$
   $R_s(x)=(Q_{s-1}(x)R_{s-1}(x)+R_{s-2}(x)$
   $Q_{s-1}(x)=R_{s-2}(x)/R_{s-1}(x)$,
   with the initial values:
   $T_o(x)=L(x), T_{-1}(x)=O, R_{-1}(x)=x^{d-1}, R_0(x)=\tau(x)$.

Here $T_s(x)$ is an error location polynomial, $R_s(x)$ is an error value polynomial and $Q_{s-1}(x)$ is an intermediate value polynomial. Subsequently, $R_s(x)$ and $T_s(x)$ can be normalized with the lowest coefficients $T_s(0)=\delta$, in which $R(x)=R_s(x)\delta$ and $T(x)=T_s(x)/\delta$. R(x) and T(x) are the results of the Euclid's algorithm when the degree $R_s<=\lfloor(d+e-3)/s\rfloor$, in which $\lfloor$ and $\rfloor$ denote an integral part.

The roots of T(x) are inverse (down-counted) locations of errors and erasures $X_k^{-1}$. The single error locations $X_k^{-1}$ are found by means of a Chien zero search in the present embodiment. Simultaneously, the error values $Y_k$ are determined in this process by means of the relation:

$$Y_k = \frac{R(X_k)}{X_k^b * T'(X_k)}$$

Here $T'(X_k)$ is the first derivative of T at the position $X_k$. In finite fields the derivatives of polynomials are formed in which n-fold addition for even n results in zero and for odd n results in the element itself. Due to this measure the searched error location and the corresponding error value are thus determined.

In the Figures identical components have the same reference symbols.

FIG. 1 shows the block diagram of an RS decoder. In this diagram the reference numeral 1 denotes a data bus via which 8-bit wide data words $D_{in}$ of the RS-coded data signal are applied to a delay device 2 for compensating signal delay times and to a function block 3 which is essentially used for forming syndromes S(x) and for determining erasure locations L(x). Parallel to the RS-coded data signal, a 1-bit wide error signal $EF_{in}$ is delayed in the delay device 2, which signal may have been supplied by a drop-out detector (not shown) or by a previous error recognition stage. The error signal $EF_{in}$, is also applied to the function block 3. Details relating to the function block 3 are described with reference to FIG. 2.

The syndromes $S(x)$ and erasure locations $L(x)$ derived in the function block 3 are passed on to a function block 5 which is provided for computing a Euclid's algorithm so as to generate an error location polynomial $T(x)$ and an error value polynomial $R(x)$. Further details relating to the function block 5 are described with reference to FIG. 3.

In the subsequent function blocks 6 and 7, which are described in greater detail with reference to FIGS. 4 and 5, the zeros of the polynomials $T_s(x)$ and $R_s(x)$ are determined and the correction of erroneous data words is performed with the obtained error values $Y_k$ and the error locations $X_k$, which data words are applied together with the error signal to the function block 7 from the output of the delay device 2. The four function blocks 3 to 7 and the delay device 2 are controlled by a control device 8. A data stream with 8-bit wide data words $D_{out}$ can be derived from a data bus 9 at the output of the function block 7. Erroneous data words have been corrected by the decoding arrangement as far as possible. Those data blocks which cannot be corrected by the decoding arrangement are accompanied with an error signal $EF_{out}$ which, in parallel with the data supplied via the data bus 9, is transmitted through a line 10.

Figure 2:
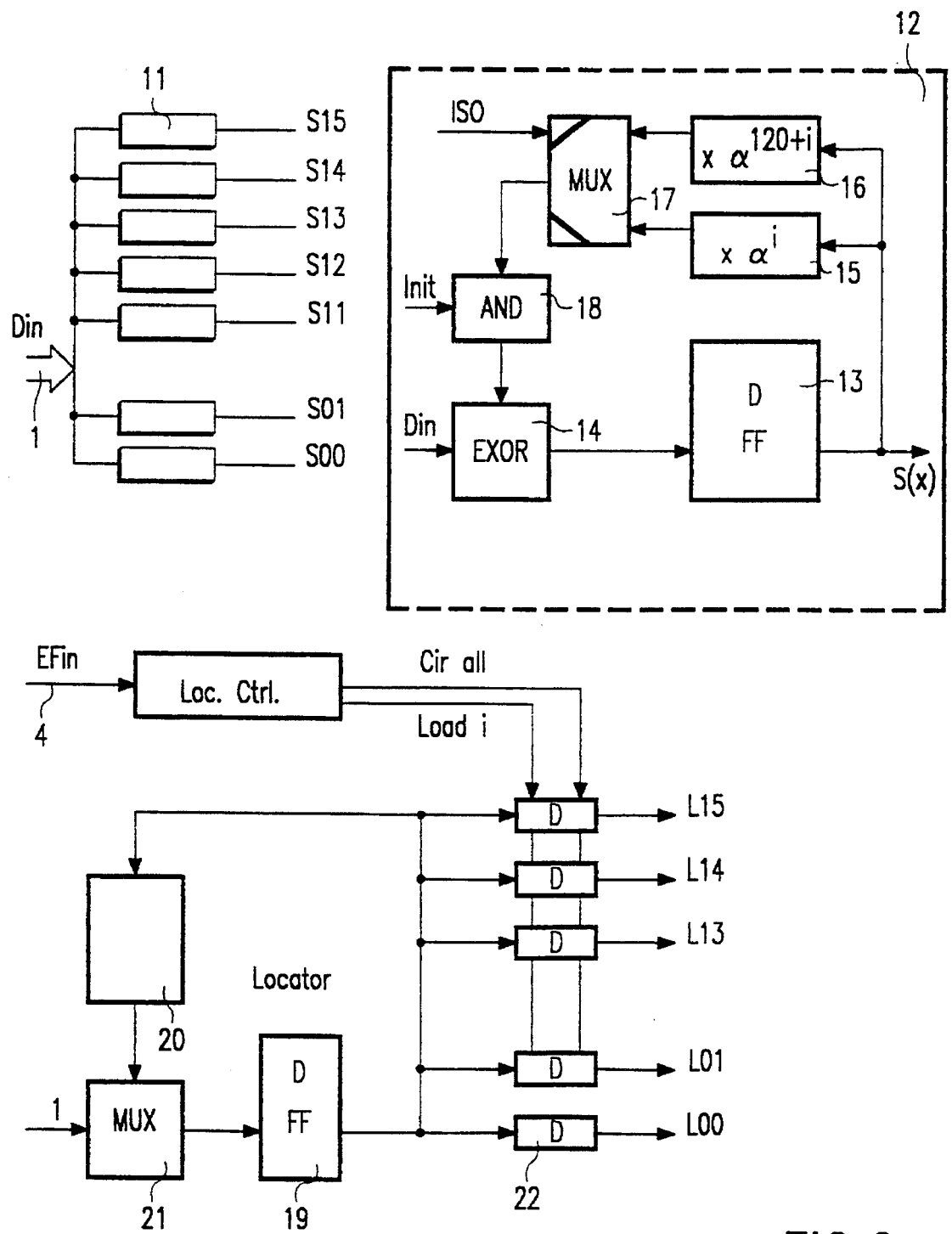
FIG. 2 is a block diagram of an arrangement for forming syndromes and for determining erasure locations in an RS-coded data signal.

In the block diagram of the function block 3 shown in FIG. 2 the syndromes $S_{00}$ to $S_{15}$ of the data signal $D_{in}$ are computed by means of sixteen syndrome generators 11. One of the sixteen syndrome generators 11 is shown in greater detail in a block 12 within a broken line square. A syndrome generator essentially comprises a feedback register arrangement 13 which is controlled by the data signal $D_{in}$ via exclusive-OR gates 14. A feedback branch of the register arrangement 13 includes two multipliers 16 and 15 whose inputs are connected to an output of the register arrangement 13. The multiplier 15 is used for multiplication by $\alpha^i$ and the multiplier 16 is used for multiplication by $\alpha^{120+1}$.

The two multipliers 15 and 16 may comprise exclusive-OR gates in known manner (EP Patent Specification 0 147 041 B1). In this case 8-bit wide data words are exclusive-OR combined in a given manner in accordance with the exponents i of the expression $\alpha^i$. For example, at $\alpha^1$ the parallel 8-bit data words transmitted through 8 lines are exclusive-OR combined in such a way that output line 0 is connected to input line 7
output line 1 is connected to input line 0
output line 2 is connected to input line 7 exclusive-OR input line 1
output line 3 is connected to input line 7 exclusive-OR input line 2
output line 4 is connected to input line 7 exclusive-OR input line 3
output line 5 is connected to input line 4
output line 6 is connected to input line 5
output line 7 is connected to input line 8

In FIGS. 6a, 6b, 6c and 6d the separate exclusive-OR gates of the multiplier 15 are shown for $\alpha^0$, $\alpha^1$ ... $\alpha^{15}$ and in FIGS. 7a, 7b, 7c and 7 d those of the multiplier 16 are shown for $\alpha^{120}$, $\alpha^{121}$ to $\alpha^{135}$.

The results obtained at the outputs of the multipliers 15 and 16 may be optionally derived by means of a multiplier 17 and coupled to an input of the exclusive-OR gate 14 via AND gate 18. When decoding the code generator polynomial $G(x)=(x+\alpha^{120})(x+\alpha^{121}) \ldots (x+\alpha^{135})$ the multiplier 17 controlled by a control signal ISO passes the result generated by the multiplier 16 on to the exclusive-OR gates 14. However, if a code generator polynomial $G(x)=(x+\alpha^0)(x+\alpha^1) \ldots (x+\alpha^{15})$ is to be decoded, the result obtained at the output of the multiplier 15 is passed on by the multiplier 16 to the exclusive-OR gates 14.

The syndrome generators Si (i=0 to 15) constitute the remainder of a division $c(x)/(x+\alpha^i)$. The syndrome generators are initiated at the start of a block by splitting up the feedback via the AND gate. In the clock provided, the syndromes $S(x)$ of the last block are passed on to the function block 5 in which erasures are determined in accordance with the mentioned Euclid's algorithm. Moreover, erasure locations $L(x)$ are determined in the function block 3. To this end a generator counts through all positions in a data block. This generator comprises a D register 19 which is fed back via a multiplier 20 and a multiplier 21. When an erasure occurs, the location is stored in a free register 22, which registers supply the erasure locations L00 to L15. These registers are also set to zero at the start of the block. If more erasures occur than are predetermined by a correction limitation, $L(x)$ is set to zero. In this case a limited correction of errors may subsequently be attempted.

Figure 3:
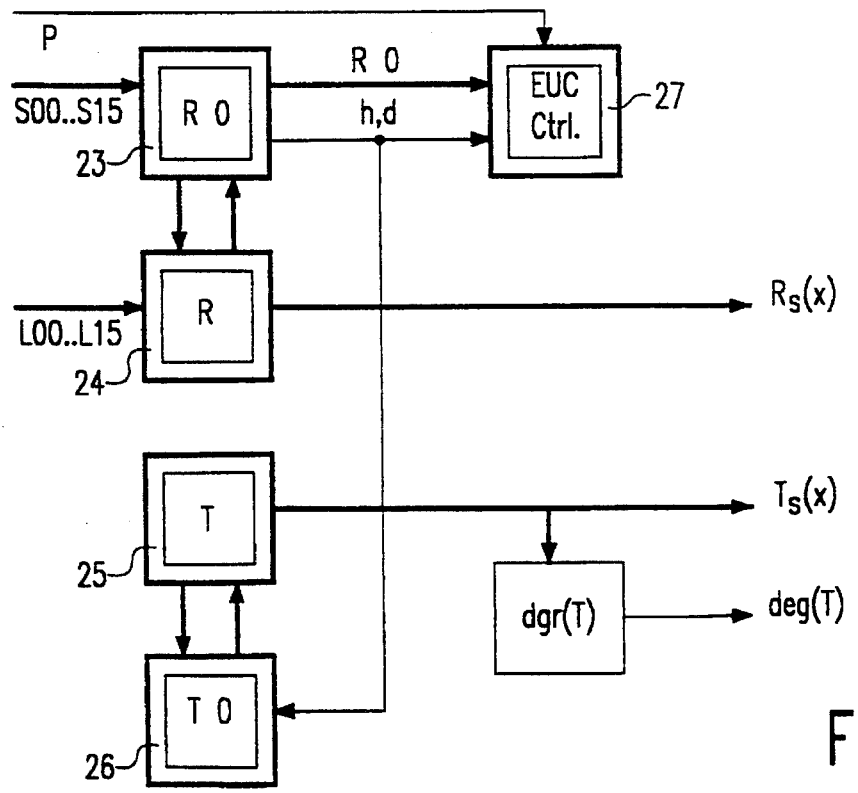
FIG. 3 shows the block diagram of an arrangement for computing error location and error value polynomials in accordance with a Euclid's algorithm.

The function block denoted by the reference numeral 5 in FIG. 1 is shown in greater detail in a block diagram in FIG. 3. The block diagram comprises two 16-bit wide registers 23 and 24. The register 23 receives the syndromes S00 to S15 generated by the syndrome generators 11. The erasure locations L00 to L15 supplied by the registers 22 are present at inputs of the register 24. Moreover, the block diagram comprises two 17-bit wide registers 25 and 26 which are loaded with constant initial values of 0 and 1, respectively. For computing the error location polynomials $T_s(x)$ and the error value polynomial $R_s(x)$ in accordance with the Euclid's algorithm defined hereinbefore, the contents of the registers 23 and 24, as well as of 25 and 26 may alternatively be interchanged. The registers 23 to 26 are controlled by a control means 27 via the degree of R0. At the end of the known computation of the error location polynomials $T_s(x)$ and the error value polynomials $R_s(x)$, which is principally also known from the journal IEEE 1990 Custom Integrated Circuits Conference, pp. 13.5.1 to 13.5.4, a signal deg(T) is derived which shows the degree of T and thus indicates how many errors can be expected in a data block in a subsequent Chien search.

Figure 4:
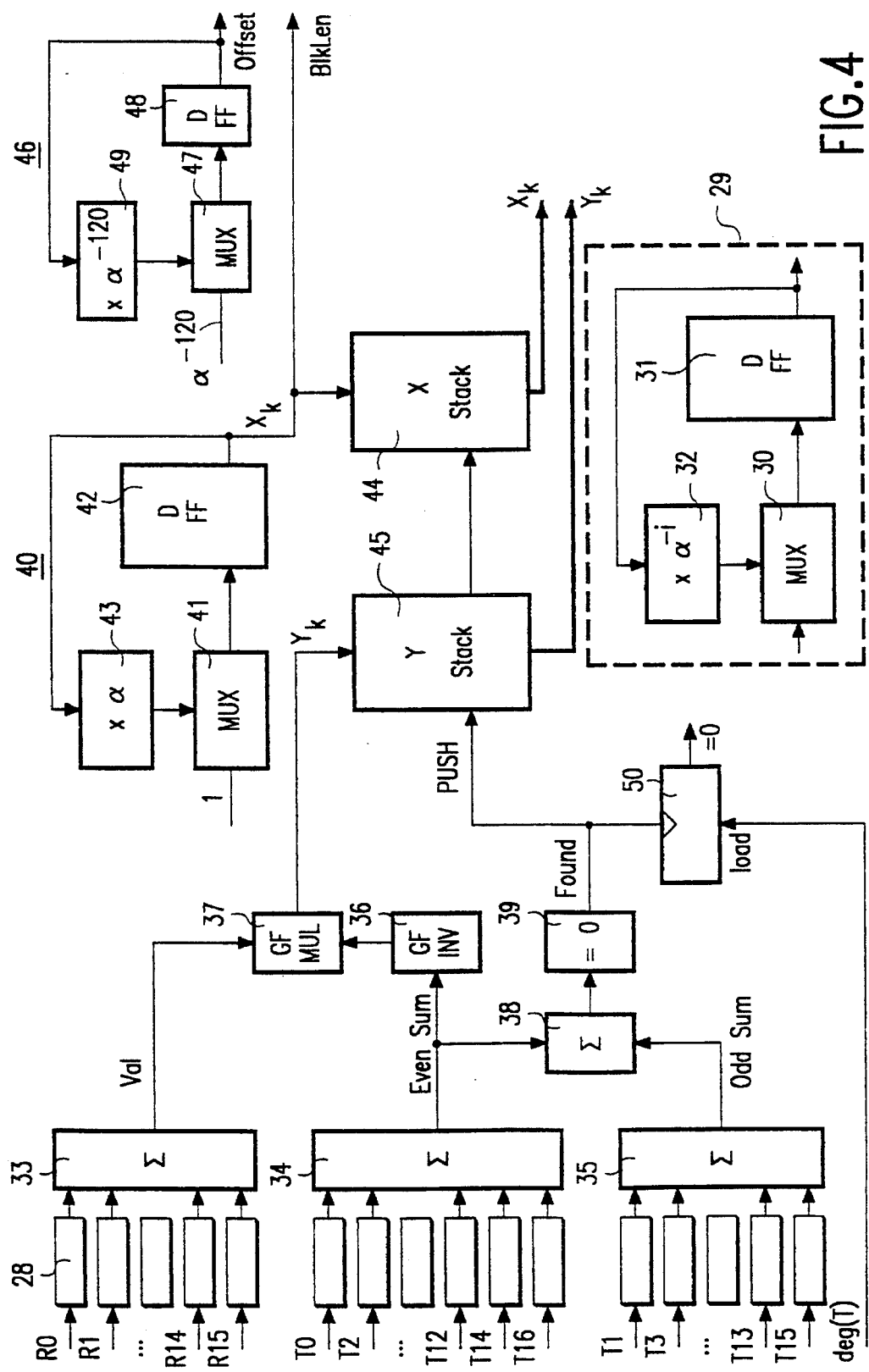
FIG. 4 is a block diagram of an arrangement for determining error locations and error values by means of a Chien zero search.

The function block 6 shown in FIG. 1 is shown in greater detail in FIG. 4. The polynomials supplied by the function block 5 are applied to thirty-three units of a cyclic decoder 28 in the relevant embodiment. The block diagram of one unit of the cyclic decoder 28 is shown in greater detail in the block 29 within dot-and-dash lines. Subsequently, the polynomial signals which are present are introduced into a register 31 via a multiplexer 30 at the start of a block. Each element $R_i$ and $T_i$ is then continuously and cyclically multiplied by the symbols $\alpha^{-i}$ made available in a block 32. When a zero $T(x)$ has been found in this way, i.e. the sum of all $T_i=0$, the error value can be computed as $Y_k=R(x_k)/T'(x_k)$ for the case where b=0.

In accordance with the rules of computation in the Galois field, the derivative $T'(x)$ yields the polynomial of the even coefficients of T. Such cyclic decoders are known from the afore-mentioned IBM journal RES Develop, vol. 30, no. 3, May 1986, pp. 259 to 269.

The signals supplied by the separate cyclic decoders are combined in adder stages 33, 34 and 35. The sums Vat, Even Sum and Odd Sum at the output of the adder stages 33 to 35 are formed by exclusive OR-ing all bits of the same level. In the present case, for example, bit 0 of the Sum Vat is formed by exclusive OR-ing the bits 0 of R0 ... R15. A division $R(x_k)/T'(x_k)$ is carried out as a multiplication by the inverse value. This computation is effected in a Galois field inverter stage 36 and in a Galois field multiplier stage 37. The sum Vat then corresponds to $R(x_k)$ while the sum Even Sum corresponds to $T'(x_k)$. The division based on a multiplication yields the desired error value $Y_k$ at the output of the Galois field multiplier stage 37.

The sums Even Sum and Odd Sum are combined in an adder stage 38; a zero request follows in a stage 39. If the signal "Found" at the output of the stage 39 has a high level, the value of a position counter 40 comprising a multiplexer 41, a register 42 and a multiplier 43, is stored simultaneously with the error value $Y_k$ found on the stack of a stack memory 44 for values of error locations $X_k$. It is then assumed that the stack memory or memories consist of registers 0 to XVI. Storage on the stack of the stack memory 44 is effected in a register 0, while the values hitherto found in registers 0 to XIV advance by one position in registers I to XV. The contents of register XV are then lost. The stack fulfils the function of a LIFO (Last In/First Out) because the search algorithm according to Chien computes inverse error locations in a backward sequence. A stack memory 45 storing the error values $Y_i$ is operated in parallel with the stack memory 44.

The block diagram of the arrangement 6 for determining error locations $X_k$ and error values $Y_k$ further includes an inverse counter 46 which also comprises a multiplexer 47, a register 48 and a multiplier 49. In contrast to the position counter 40, however, the register 48 arranged in a feedback configuration is loaded with the value $\alpha^{-120}$ at the start of a data block. The data words (offset) present at the output of the register 48 are continuously multiplied by $\alpha^{-120}$ in the multiplier 49.

The block diagram of FIG. 4 also includes a counter 50 which is loaded with the value of the signal deg(T) and is reset by applying the signal "Found" supplied by the stage 39. If the counter remains at the value 0 at the end of a run through the data block, then this is a guarantee that the degree of the polynomial T (degree=1+index of the highest coefficient unequal to 0), which gives an indication about the number of the errors to be expected, corresponds to the actually found zeros in a data block and that consequently the decoding operation has proceeded successfully. In the opposite case, there is an incorrigible error.

After n clocks of a data block the error locations $X_k$ and error values $Y_k$ collected in the nesting memories 44 and 45 are parallel transferred to the arrangement 7 so that the arrangement 6 can be initialized and is subsequently available for a renewed Chien search.

Figure 5:
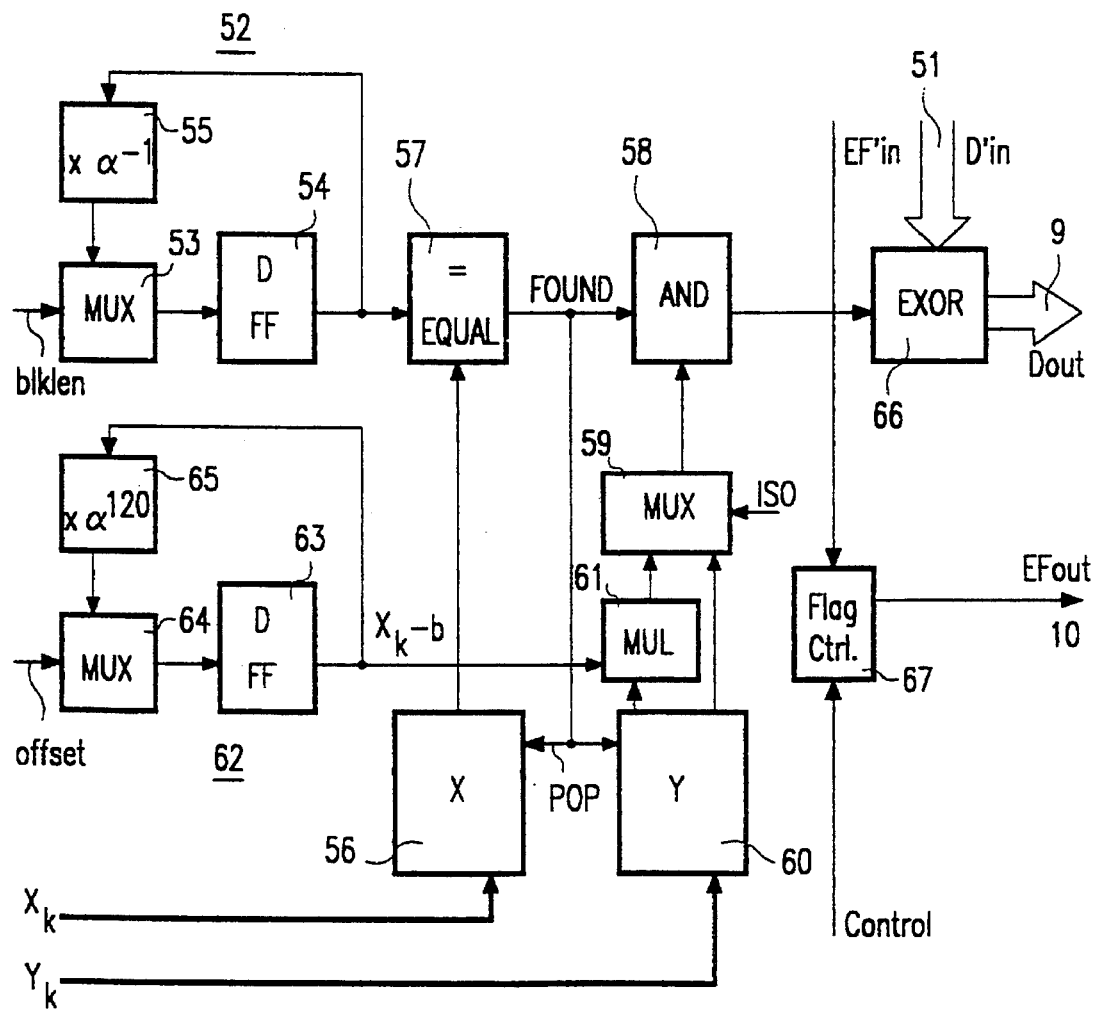
FIG. 5 is a block diagram of an arrangement for correcting the RS-coded data signals.

FIG. 5 shows a block diagram of the arrangement 7 for correcting the delay time-adapted data signals supplied at the output of the delay device 2 and applied at 51.

In this block diagram the sequence of the values $X_k$ and $Y_k$ is reversed by means of an inverse position counter 52. This inverse position counter 52 comprises a multiplier 53, a register 54 and a stage 55. The arrangement is shown in such a way that at the start of the block the register 54 is loaded with the final value of the block length "BlkLen" via the multiplexer 53. The output values of the register 54 are fed back with values of the symbol $\alpha^{-1}$ during the remaining period via the stage 55 and multiplied by these values. An error location $X_k$ is found when the data supplied by the inverse position counter 52 are identical with the contents of a register 0 and a stack memory 56 comprising the error locations $X_k$. The comparison is performed in a comparison stage 57 which supplies a corresponding output signal "Found". This signal "Found" represents a gate pulse signal for an AND gate 58, another input of which is connected via a multiplexer 59 to an output of a stack memory 60 in which the error values $Y_k$ of the stack memory 45 have been transferred when b=0 and thus a data signal of the code generator polynomial $G(x)=(x+\alpha^0)(x+\alpha^1)\ldots(x+\alpha^{15})$ is to be decoded.

If on the other hand the data signal of a code generator polynomial $G(x)=(x+\alpha^{120})(x+\alpha^{121})\ldots(x+\alpha^{135})$ is to be decoded (b=120), the other input of the AND gate 58 is connected via the multiplexer 59 to the output of a multiplier 61 whose input is connected to an output of the stack memory 60 and to an output of a further up-counter 62. Similarly as the counters described hereinbefore, the counter 62 also has a feedback register 63 in which the signal "offset" generated by the inverse counter 46 is entered via a multiplexer 64. A multiplier 65 arranged in the feedback branch of the register 63 multiplies the output values of the register 63, starting from the value $\alpha^{120}$. The factors $x_k^{-b}$ then found are used for correcting the error values $Y_k$ stored in the stack memory 60. A corrected error value $Y_k$ adapted to the code generator polynomial $$G(x)=(x+\alpha^{120})(x+\alpha^{121})\ldots(x+\alpha^{135})$$

is then present at the output of the multiplier 61, which value complies with the expression $$Y_k = \frac{R(x_k)}{x_k^b * T'(x_k)} = \frac{R(x_k)}{T'(x_k)} * x_k^{-b}$$

The signal "Found" supplied at the output of the comparison stage 57 is also used for controlling the two stack memories 56 and 60. If the signal "Found" has a logic high level, the upper value is removed from the stack memory 56. This means that registers I to XV in the stack memories 56 and 60 are copied at the register positions 0 to XIV and that the register XV becomes a logic zero. When all errors have been corrected, a logic zero is present on the stack. In this case no further coincidence can occur with the inverse position counter 52.

The error value $Y_k$ present at the output of the AND gate 58 is logically combined in an exclusive-OR stage 66 with the data value Din delayed in the delay device 2: the actual error correction is being performed. The error-corrected data signal Dout is supplied at the output 9. The error signal EFin also delayed in the delay device 2 is applied to the output bus 10 via a stage 67, dependent on the control device 8 of the RS decoder.

RS-coded data signals for the two code generator polynomials are essentially decoded in two stages in the relevant circuit arrangement. In a first stage the error value $Y_k$ for data signals of the code generator polynomial $$G(x)=(x+\alpha^{120})(x+\alpha^{121})\ldots(x+\alpha^{135})$$

is determined and the error correction is performed by means of the determined error value. If data signals of a code generator polynomial $$G(x)=(x+\alpha^{120})(x+\alpha^{121})\ldots(x+\alpha^{135})$$

are to be decoded, the error value $Y_k$ determined in the first stage is only corrected by a factor $x_k^{-b}$ parallel derived in a second stage. This mode of signal processing in two stages has the advantage that a continuous rate of operation of approximately 20 MHz (160 mbit/s) for 8-bit wide data words can be achieved. During decoding from data block to data block it is then possible to switch from one to the other code generator polynomial. A further advantage is that the circuit arrangement according to the invention does not require any elaborate sub-circuits for calculating the error values $Y_k$. The relevant circuit arrangement is particularly suitable for recognizing and correcting errors in RS-coded data signals reproduced by magnetic tape. Based on the special structure of the circuit arrangement according to the invention, erasures in the reproduced data signal may also be ignored, for example, for a trial correction of the non-marked errors. Moreover, it is possible to reduce the error corrigibility inherent in the circuit arrangement according to the invention in favour of a reliable error recognition so as to mask larger, incorrigible beam errors in a subsequently arranged device.

I claim:

1. A circuit arrangement for decoding RS-coded data signals coded in accordance with a code generator polynomial $G(x)=(x+\alpha^{0+b})(x+\alpha^{1+b}) \ldots (x+\alpha^{15+b})$, where b=0 or 120, comprising:

(a) a first device for forming syndromes ($S(x)$) for successive data blocks and for determining erasure locations ($L(x)$) in the RS-coded data signals, (b) a second device connected to the first device for using a Euclid's algorithm in which
$T_s(x)=(Q_{s-1}(x)T_{s-1}(x)+T_{s-2}(x)$
$R_s(x)=(Q_{s-1}(x))R_{s-1}(x)+R_{s-2}(x)$ and $Q_{s-1}(x)=(R_{s-2}(x)/R_{s-1}(x))$, in which $T_s(x)$ is an error location polynomial, $R_s(x)$ is an error value polynomial, and $Q_{s-1}(x)$ is an intermediate value polynomial, (c) a third device connected to the second device for determining error locations $X_k$ and error values $Y_k$ by means of a Chien zero search defined by the relation:

$$Y_k = \frac{R(X_k)}{X_k^b * T(X_k)}$$

in which b is the constant offset in exponents of α in the code generator polynomial and $T'(X_k)$ is the first derivative at location $X_k$, (d) a fourth device connected to the third device for correcting data words within an RS-coded data block on the basis of the determined error locations $X_k$ and error values $Y_k$, (e) said first device comprising syndrome generators for determining syndromes ($S(x)$), each generator comprising
  (i) first exclusive-OR stages to whose inputs data words of the RS-coded data signals are bit-parallel applied,
  (ii) a first register for storing the data words supplied by the first exclusive-OR stages,
  (iii) a first multiplier for multiplying the data words present at the output of the first register by a constant $\alpha^i$, in which i is a control variable from 0 to 15,
  (iv) a second multiplier for multiplying the data words present at the output of the first register by a constant $a^{i+120}$,
  (v) a first multiplexer which passes on the data from an output of the first multiplier to other inputs of the first exclusive-OR stages when RS-coded data signals in accordance with a code generator polynomial starting with $\alpha^0$ are decoded and which passes on the data from an output of the second multiplier to the other inputs of the exclusive-OR stages when RS-coded data signals in accordance with a code generator polynomial starting with $\alpha^{120}$ are decoded, (f) said third device comprising:
  (i) an up-counter for up-counting the data words present in a data block and for supplying a counting value (x) for the Chien zero search,
  (ii) a first stack memory in which the counting values (x) supplied by the up-counter can be written,
  (iii) a second stack memory in which data read from the first stack memory can be written at the end of each data block,
  (iv) a third stack memory in which the error values ($Y_k$) can be written simultaneously when the counting values ($X_k$) are written in the first stack memory,
  (v) a fourth stack memory in which data read from the third stack memory can be written at the end of a data block, and
  (vi) an inverse counter operated parallel to the up-counter and having an offset of $\alpha^{-120}$ with respect to the up-counter, (g) said fourth device comprising:
  (i) a down-counter for down-counting, starting with the value of a data block length,
  (ii) an arrangement for comparing the counting value present at an upper position in the second stack memory with the counting values supplied by the down-counter for deriving a control signal (Found) when the values provided are equal,
  (iii) an AND gate, one input of which is connected to an output of the comparison arrangement,
  (iv) a further second up-counter controlled by the inverse counter and having an offset of 120,
  (v) a third multiplier for multiplying the error value ($X_k$) present at an upper position in the fourth stack memory by the counting value supplied by the further second up-counter,
  (vi) a second multiplexer which passes on the error value ($X_k$) present at an upper position in the fourth stack memory to another input of the AND gate when RS-coded data signals in accordance with a code generator polynomial starting with $\alpha^0$ are decoded and which passes on the value $Y_k$ present at the output of the second multiplier to the other input of the AND gate when RS-coded data signals in accordance with a code generator polynomial starting with $\alpha^{120}$ are decoded,
  (vii) second exclusive-OR stages whose first inputs receive the signal which can be derived from outputs of the AND gate, whose second inputs receive bit-parallel signal delay-adapted data words of the RS-coded data signals and from whose output error-corrected data words can be derived.

2. A circuit arrangement as claimed in claim 1, characterized in that the up-counter comprises a third multiplexer stage preceding a second register, in which an input of the third multiplexer stage receives the value $\alpha^0=1$ at the start of a block period and in which, during the remaining block period, another input of the third multiplexer stage conveys values, multiplied by a value of $\alpha^0$, of the output values supplied by said second register.

3. A circuit arrangement as claimed in claim 1, characterized in that the down-counter comprises a fourth multiplexer stage preceding a third register, in which an input of the fourth multiplexer stage receives a block length value at the start of a block period and in which, during the remaining block period, another input of the fourth multiplexer stage conveys the output values supplied by said third register.

4. A circuit arrangement as claimed in claim 1, characterized in that the inverse counter comprises a fifth multiplexer stage preceding a further fourth register which receives a value $\alpha=-120$ via the fifth multiplexer stage at the start the block period and, during the remaining block period, receives a value present at the output of said fourth register, which value is multiplied by $\alpha^{120}$ in a fourth multiplier stage.

5. A circuit arrangement as claimed in claim 4, characterized in that the further second up-counter comprises a fifth multiplier stage preceding a fifth register which receives a value present at the output of the fourth register via the fifth multiplexer stage at the start of a block period and, during the remaining block period, receives a value present at the output of said fifth register, which value is multiplied by $\alpha^{120}$ in the fifth multiplier stage.

6. A circuit arrangement as claimed in claim 1, characterized in that each multiplier stage is formed as an exclusive-OR gate for multiplying values by a factor of $\alpha^{i+b}$, in which i=0 to 15 and b=120 or 0.

7. A circuit arrangement as claimed in claim 2, characterized in that each multiplier stage is formed as an exclusive-OR gate for multiplying values by a factor of $\alpha^{i+b}$, in which i=0 to 15 and b=120 or 0.

8. A circuit arrangement as claimed in claim 3, characterized in that each multiplier stage is formed as an exclusive-OR gate for multiplying values by a factor of $\alpha^{i+b}$, in which i=0 to 15 and b=120 or 0.

9. A circuit arrangement as claimed in claim 4, characterized in that each multiplier stage is formed as an exclusive-OR gate for multiplying values by a factor of $\alpha^{i+b}$, in which i=0 to 15 and b=120 or 0.

10. A circuit arrangement as claimed in claim 5, characterized in that each multiplier stage is formed as an exclusive-OR gate for multiplying values by a factor of $\alpha^{i+b}$, in which i=0 to 15 and b=120 or 0.

* * * * *